United States Patent [19]

Chen et al.

[11] Patent Number: 5,359,767
[45] Date of Patent: Nov. 1, 1994

[54] METHOD OF MAKING MULTILAYERED CIRCUIT BOARD

[75] Inventors: William T. Chen, Endicott; Thomas P. Gall, Endwell; James R. Wilcox, Vestal; Tien Y. Wu, Endwell, all of N.Y.

[73] Assignee: International Business Machines Corporation, Armonk, N.Y.

[21] Appl. No.: 112,499

[22] Filed: Aug. 26, 1993

[51] Int. Cl.⁵ .............................................. H05K 3/36
[52] U.S. Cl. ........................................ 29/830; 29/852; 174/266; 427/96; 427/97
[58] Field of Search .................. 29/830, 852; 174/266; 427/96, 97

[56] References Cited

U.S. PATENT DOCUMENTS

| | | | |
|---|---|---|---|
| 3,648,357 | 3/1972 | Green, Jr. | 29/492 |
| 3,678,570 | 7/1972 | Paulonis et al. | 29/498 |
| 4,528,072 | 7/1985 | Kurosawa et al. | 29/830 |
| 4,685,210 | 8/1987 | King et al. | 29/830 |
| 4,788,766 | 12/1988 | Burger et al. | 29/830 |
| 4,803,450 | 2/1989 | Burgess et al. | 333/238 |
| 4,818,728 | 4/1989 | Rai et al. | 437/209 |
| 4,890,784 | 1/1990 | Bampton | 228/194 |
| 5,038,996 | 8/1991 | Wilcox et al. | 228/121 |
| 5,046,238 | 9/1991 | Daigle et al. | 29/830 |
| 5,090,609 | 2/1992 | Nakao et al. | 228/123 |
| 5,129,142 | 7/1992 | Bindra et al. | 29/852 |
| 5,142,775 | 9/1992 | Wiley | 29/830 |
| 5,147,084 | 9/1992 | Behun et al. | 228/56.3 |
| 5,155,302 | 10/1992 | Nguyen | 174/88 |
| 5,191,174 | 3/1993 | Chang et al. | 174/266 |
| 5,199,163 | 4/1993 | Ehrenberg et al. | 29/830 |

FOREIGN PATENT DOCUMENTS

3316017 8/1984 Germany .................. H05K 3/42

OTHER PUBLICATIONS

IBM Technical Disclosure Bulletin, vol. 27, No. 12, May 1985, "Bonding Conductors to Microelectronic Devices and Packages", by J. Abney et al., pp. 7005-7008.

IBM Research Disclosure, No. 323, Mar. 1991, "Maintaining Dimensional Stability During Lamination", by J. Poetzinger et al.

*Primary Examiner*—Carl J. Arbes
*Attorney, Agent, or Firm*—Lawrence R. Fraley

[57] ABSTRACT

A method of making a multilayered circuit board wherein at least two layered subassemblies, each comprising a dielectric layer and at least one conductive layer therein, are bonded together. Each subassembly includes a through-hole extending therethrough which is aligned with a respective through-hole of the other prior to bonding. The subassemblies are compressed at a predetermined pressure (e.g., 300 psi) and then heated to a first temperature (e.g., 300° C.) for an established time period, resulting in formation of a bond between the two through-holes. The resulting alloy formed from this bond possesses a melting point significantly greater than that of the subassembly dielectric (e.g., PTFE). Following this time period, the compressed subassemblies are heated to an even greater temperature (e.g., 380° C.), again for an established time period, to assure dielectric flow. The subassembly is then cooled and the pressure removed. The method possesses two significant features: (1) effective engagement between respective pairs of through-holes in the compressed subassemblies; and (2) prevention of dielectric incursion within the bond formed between the respective pairs of through-holes, which incursion could adversely affect the electrical connection therebetween.

13 Claims, 5 Drawing Sheets

METHOD OF MAKING MULTILAYERED CIRCUIT BOARD

TECHNICAL FIELD

The invention relates to printed circuit boards, and particularly those of the multilayered variety.

CROSS REFERENCE TO CO-PENDING APPLICATION

In Ser. No. 07/536,145, entitled "Au-Sn Transient Liquid Bonding In High Performance Laminates" and filed Jun. 11, 1990, there is defined a method for simultaneously laminating circuitized dielectric layers to form a multilayered, high performance circuit board. Two metals are chosen to form an initial eutectic layer that, when solidified, forms an alloy bond that will only remelt at a second temperature greater than that causing the eutectic bond. Once solidified, the alloy is designed to remain solid throughout subsequent laminations. The teachings of this filed application are incorporated herein by reference. Ser. No. 07/536,145 is now U.S. Pat. No. 5,280,414, having issued Jan. 18, 1994.

BACKGROUND

Multilayered printed circuit boards, including those referred to as of the high density variety, are typically constructed of several electrically conductive layers separated by layers of dielectric material. Some of the conductive layers may be utilized as power and ground planes while other conductive layers may be patterned for electrical signal connections (e.g. between integrated circuit chips). Layer-to-layer interconnections may be used in such constructions and accomplished using what is referred to as plated-through-holes (PTH's), such holes typically including a plating of electrically conductive material (e.g., copper) thereon. In those situations wherein electrical interconnections are desired between adjacent conducting layers, it has been common in the art to provide such connections with what are often referred to as "vias". These hole-type connections, though typically not extending through the entirety of the board's thickness, are also coated (e.g., plated) with an internal conductive layer (e.g., copper). Such "vias" and through-holes are typically provided by drilling.

The term "through-hole" as used herein is meant to include the aforementioned PTH's as well as "vias" that may only interconnect selected conductive layers in the final structure (and thus possibly be only internally positioned).

Examples of various types of multilayered printed circuit board (PCB) constructions are defined in U.S. Pat. No. 4,030,190 (K. Varker), U.S. Pat. No. 4,554,405 (K. Varker), U.S. Pat. No. 4,854,038 (J. Wiley), U.S. Pat. No. 4,864,772 (D. Lazzarini et al.), U.S. Pat. No. 4,868,350 (J. Hoffarth et al.) and U.S. Pat. No. 5,191,174 (C. S. Chang). All of these patents are assigned to the same assignee as the instant invention. Additional examples, including those which describe various steps in producing such final composite structures, are shown in U.S. Pat. No. 4,803,450 (J. Burgess), U.S. Pat. No. 5,046,238 (R. Daigle) and German Patent DE3316017 (M. Bergmann).

As defined in the above and other patents, and as is also well known in the art, such multilayered printed circuit board constructions typically utilize copper or a similar highly conductive material for the signal and/or power and/or ground conductive planes. The term "printed circuit board" as used herein is thus meant to define a structure including at least one dielectric layer and at least one conductive layer located therein and/or thereon. One well known example of a dielectric material for use in such construction is fiberglass reinforced epoxy resin (aka FR4). Other materials may include polyimide and polytetrafluoroethylene (PTFE), the latter of more recent vintage when relatively low dielectric materials are desired. As will be understood from the following, the teachings of the present invention are especially adaptable to multilayered PCB's wherein PTFE or the like is used as the dielectric material and copper is used as the conductive (metal) material for the various through-holes and conductive layers used therewith.

As defined herein, the present invention comprises a method of making a multilayered circuit board construction comprised of individual layered subassemblies each including electrically conductive wiring and at least one through-hole therein. The resulting multilayered structure as defined herein is characterized by the provision of at least two of these subassemblies being bonded together such that respective through-holes of each are aligned, engaged, and coupled through formation of a metallurgical bond at the through-hole jointure. Such a bond is achieved through the unique use of heat and pressure, and precise quantities of selected metals (e.g., gold and tin) in the jointure location. Significantly, the through-holes are of a pre-established configuration with precisely defined (in thickness) sidewalls that, uniquely, allow at least partial compression (collapse) of the sidewalls during pressure application at a designated temperature. Such compression, possible by several such paired through-hole combinations, assures effective engagement therebetween so that sound electrical connection is made possible across the entire final PCB structure.

Still further, the method defined herein results in formation of the aforementioned metallurgical bond while also, uniquely, providing a resulting alloy at the through-hole jointure that possesses a melting point much greater than that of the initial eutectic alloy formed. Most significantly, this new melting point is also greater than the corresponding melting point of the dielectric materials (e.g., PTFE) used in each layered subassembly being so bonded. This unique result enables subsequent heating of the initially bonded subassemblies to an elevated temperature above the dielectric's melting point, resulting in dielectric flow as desired. Because the formed alloy remains in the solid state during such dielectric flow, the heated dielectric material is prevented from migrating or otherwise moving into the through-hole jointure and thereby possibly adversely affecting the electrical connection formed at this location.

The present invention thus represents an improvement over the process defined in Ser. No. 5,280,414, as well as those processes mentioned in U.S. Pat. Nos. 4,803,450 and 5,046,238 and German patent DE3316017, and is thereby deemed to constitute a significant advancement in the art.

DISCLOSURE OF THE INVENTION

It is, therefore, a primary object of the present invention to enhance the art of multilayered circuit boards.

It is a particular object to provide a method of making a multilayered circuit board wherein effective engagement between aligned through-holes of adjacent layered subassemblies being bonded to form part/all of the final board structure is assured.

It is a further object to provide such a method which will further assure effective dielectric flow (melt) during application of pressure at a selected temperature, while effectively preventing dielectric material from adversely affecting the through-hole jointures which serve to provide critical paths for electrical current flow in the finished product (PCB).

In accordance with one aspect of the invention, there is defined a method of making a multilayered circuit board assembly which includes at least two layered subassemblies each including at least one dielectric layer, electrically conductive wiring in the form of at least one conductive layer and at least one conductive through-hole therein. The method comprises the steps of aligning the layered subassemblies relative to one another such that at least a first of said conductive through-holes of one layered subassembly is aligned with and engages a second conductive through-hole in a second layered subassembly, the first and second conductive through-holes including a layer of first metal thereon, said second conductive through-hole further including a layer of second metal thereon. These subassemblies are subjected to pressure at a level sufficient to cause at least partial compression of the first and second conductive through-holes, following which the layered subassemblies are heated to a pre-established temperature for a predetermined time period sufficient to form a metallic bond between the first and second metals on the conductive through-holes. The layered subassemblies are then cooled.

BEST MODE FOR CARRYING OUT THE INVENTION

Figure 1:
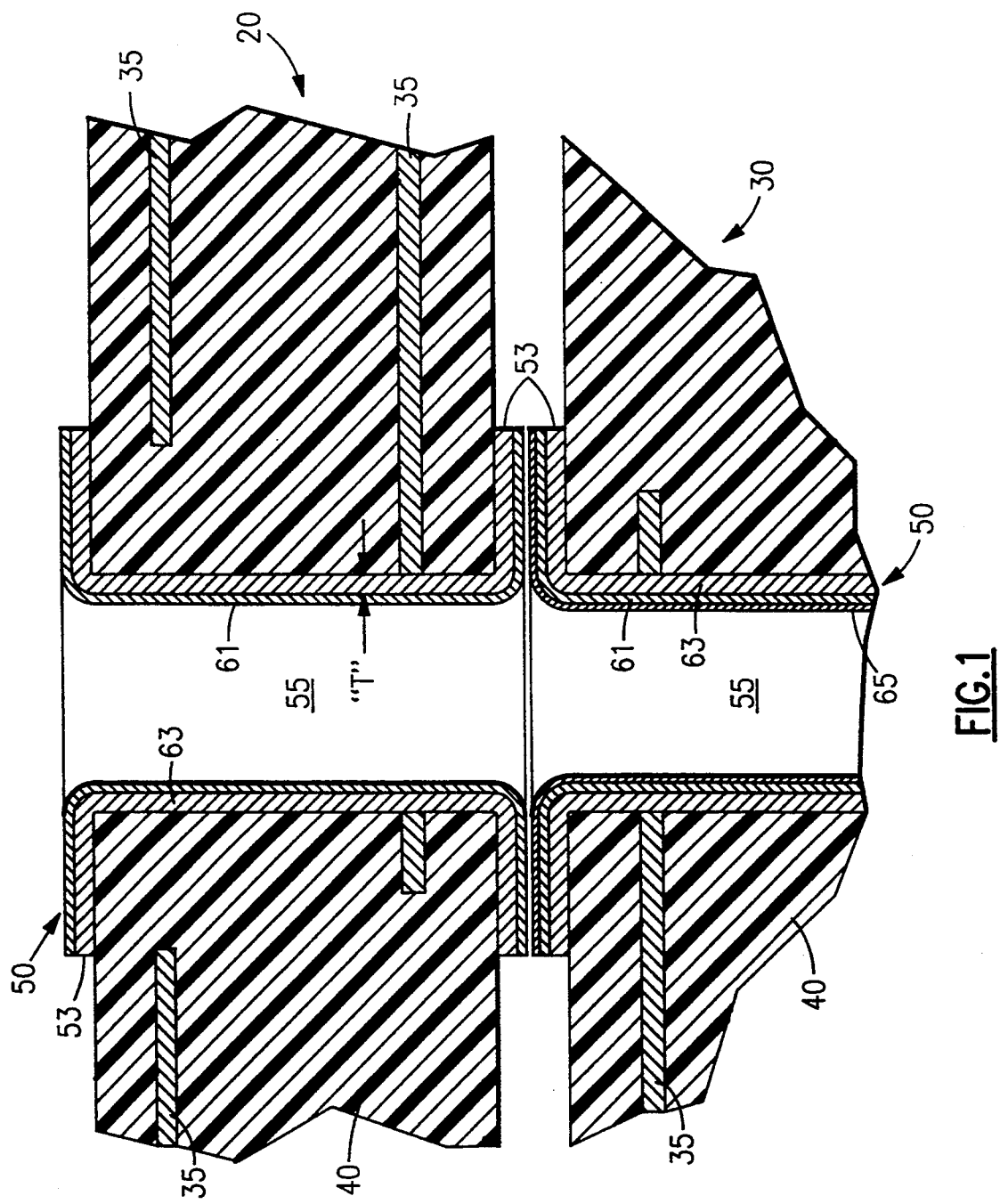
FIGS. 1-4 represent the various steps of making a multilayered circuit board assembly in accordance with one embodiment of the invention, these views illustrating at least two layered subassemblies which will comprise the final assembly.

For a better understanding of the present invention, together with other and further objects, advantages and capabilities thereof, reference is made to the following disclosure and appended claims in connection with the above-described drawings.

The following disclosure and associated drawings define a process for making a multilayered circuit board assembly possessing the unique characteristics defined herein. As understood, this final assembly will include a plurality of layered subassemblies joined together in a predetermined manner such that respective ones of these will possess the operational characteristics (wiring density, resistance) defined.

In FIGS. 1-4, there are shown the various steps of making a multilayered circuit board assembly in accordance with one embodiment of the invention. These FIGS. illustrate one example of a layered subassembly 20 capable of being combined with another layered subassembly 30 to form the multilayered circuit board of the invention. It is to be understood that the configuration depicted in these FIGS. is representative of only one version of such subassemblies and the invention is thus not limited thereto. In the simplest form of the invention, it is to be understood that each layered subassembly as used herein will include at least one dielectric layer 40 and attached or internally contained singular conductive layer 35. By the term conductive layer as used herein is meant to include a singular layer of electrically conductive material (the preferred material being copper), said layer capable of functioning as a signal, power or ground layer, or combinations thereof. The term "compression" as used herein is meant to define a condition of reduced height for the invention's through-holes as a result of being subjected to pressures typically associated with such processes as lamination. Under such definition, it is understood that some deformation must occur.

It is further understood that each layered subassembly may include additional conductive layers, depending on the operational requirements of the final circuit board assembly. In one example, it may be possible to utilize a total of about ten such conductive layers, strategically positioned in accordance with a predefined pattern. In the drawings, two such conductive layers 35 are shown for the layered subassembly 20.

Additionally, it is also within the scope of the present invention to produce a multilayered circuit board assembly having more than two layered subassemblies. By way of example, it is possible, using the unique teachings of the present invention, to produce a multilayered assembly including twenty individual layered subassemblies as part thereof. Significantly, the method defined herein is readily capable of being utilized to provide such a multilayered and complex structure.

As stated above, the invention is particularly adapted for use with PTFE or the like dielectric materials, as well as conductive layers comprised substantially of copper. Further, the invention is particularly adapted for use with through-holes (defined in greater detail hereinbelow) comprised substantially of copper as the primary conductive material, this copper further including a layer (e.g., plating) of precious metal (e.g., gold) thereon. As further defined herein below, at least one of these conductive through-holes will include a second layer (e.g., plating) of another metal (preferably tin). The present invention is not to be limited to these particular materials, however, in that other materials may be utilized quite successfully.

As defined herein, the method of the present invention comprises a singular process wherein both lamination and interconnection occur between at least two layered subassemblies to produce the final multilayered structure. Each subassembly is capable of being individually tested and/or repaired prior to final lamination and connection with respective additional subassemblies. Additionally, it is also within the scope of the invention to individually test and/or repair respective pairs of such laminated and connected subassemblies prior to incorporation thereof within additional layered elements to form the final structure. Such testing and/or repair possibilities greatly enhance the yield in the final product while also serving to substantially shorten process time and assure overall cost savings. The present invention also permits the construction of multi-layered assemblies with extremely high aspect ratio (height to diameter) through-holes. The invention thus represents a significant advancement in the art.

As will be defined herein below, the invention utilizes what is referred to as transient liquid bonding (TLB), which, as defined in the aforementioned U.S. Pat. No. 5,280,414, is a diffusion bonding process which involves the deposition of different conductive surface metals which together are then capable of forming a eutectic melt. The surfaces being bonded must be comprised of highly conductive metal, such as copper, and coated with the metals, brought into physical contact with one another and then heated above the eutectic temperature, the resulting interdiffusion thereby forming a melt. Solidification of this liquid region through further diffusion results in bonding of the metallic surfaces. Significantly, the TLB process does not require the use of flux and may utilize minimal amounts of solder. Bridging between adjacent bonding surfaces is reduced in comparison to conventional soldering processes. Most significantly, it is understood from the teachings herein that the present invention, while utilizing the advantages of the TLB process as defined in U.S. Pat. No. 5,280,414, represents a significant improvement over the method in said application and thus represents an advancement in the art. Again, the teachings of U.S. Pat. No. 5,280,414 are incorporated herein by reference.

In FIG. 1, each of the individual layered subassemblies 20 and 30 is shown to include at least one through-hole 50 which forms a part thereof. As shown, each through-hole extends through the entire thickness of the PTFE dielectric 40 and includes opposing, external land segments 53 as part thereof. Preferably, dielectric 40 also includes a filler material (e.g., silicon dioxide in particle form). (The lower land segment for subassembly 30 is not shown but understood to exist.) These outwardly extending land segments 53 project from a centrally-located hollow cylindrical portion 55 of the through-hole and, in initial orientation (FIG. 1), are located on the respective opposing outer surfaces of the interim dielectric. Each through-hole is preferably comprised of copper or similarly conductive metal as is known in the art. Significantly, each through-hole is of hollow construction.

Although only one through-hole is shown for each layered subassembly, it is fully understood that the invention is not limited to this number in that, in a preferred embodiment of the invention, several such through-holes are utilized. In one embodiment of the invention, for example, a total number of about 10,000 such through-holes may be provided per subassembly, for alignment with and engagement to a respective, similar number of such through-holes in the other subassembly.

In a preferred embodiment, the copper material for each through-hole possesses a thickness of only about 0.3 mils. Such a thickness is represented by the letter "T" in FIG. 1. The above thickness is not meant to limit the invention, however, in that other thicknesses are possible. In a layered subassembly having an overall dielectric thickness of about nine mils, and using through-holes having a central hollow cylindrical portion with an external diameter within the range of from about three mils to about ten mils, total copper thicknesses within the range of about 0.2 mils to about one mil may be successfully utilized. These parameters are considered critical with respect to the present invention due to the requirement that these conductive through-holes at least partially compress during the initial phases of producing the multilayered circuit board defined herein. Such partial compression is deemed significant to assure proper engagement (and therefore electrical coupling) between many respective pairs of such elements, thereby compensating for possible lack of planarity in the respective dielectric portions of each subassembly. Because the desired conductive paths in the final multilayered structure are through these engaged pairs, including from opposing surfaces thereof to various internal conductive layers such as shown herein, such positive connection between respective pairs of such elements is absolutely essential to the successful operation of the final product.

In FIG. 1, subassemblies 20 and 30 are aligned such that the respective land portions 53 of through-holes 50 are precisely aligned relative to one another. Significantly, the upper through-hole in FIG. I includes a layer of first metal (61) thereon, which metal is, of course, in addition to the copper which forms the lands 53 and cylindrical body portion 63. In a preferred embodiment, each first metal 61 (both through-holes including this metal) is preferably gold and is provided (e.g., plated) of a thickness of from about 0.12 mils to about 0.32 mils. When using copper having a thickness of 0.30 mils, the gold preferably has a thickness of 0.24 mils, thus slightly thinner than the copper. The gold layer 61 in subassembly 30 is of similar thickness.

In addition to the above first layers on the copper, the lower through-hole of subassembly 30 further includes a second additional metal, preferably tin. This layer is represented by the numeral 65 in FIG. 1. As defined in U.S. Pat. No. 5,280,414, this tin eventually forms a eutectic alloy with the gold during the TLB process, this to be defined in greater detail hereinbelow.

The tin layer of 65 may have a thickness of from about 0.04 mils to about 0.16 mils, and is preferably of a thickness of 0.10 mils when using 0.30 mil copper and 0.24 mil gold.

Alignment of the two subassemblies 20 and 30 is preferably accomplished using techniques known in the art and further description is not deemed necessary.

Figure 2:
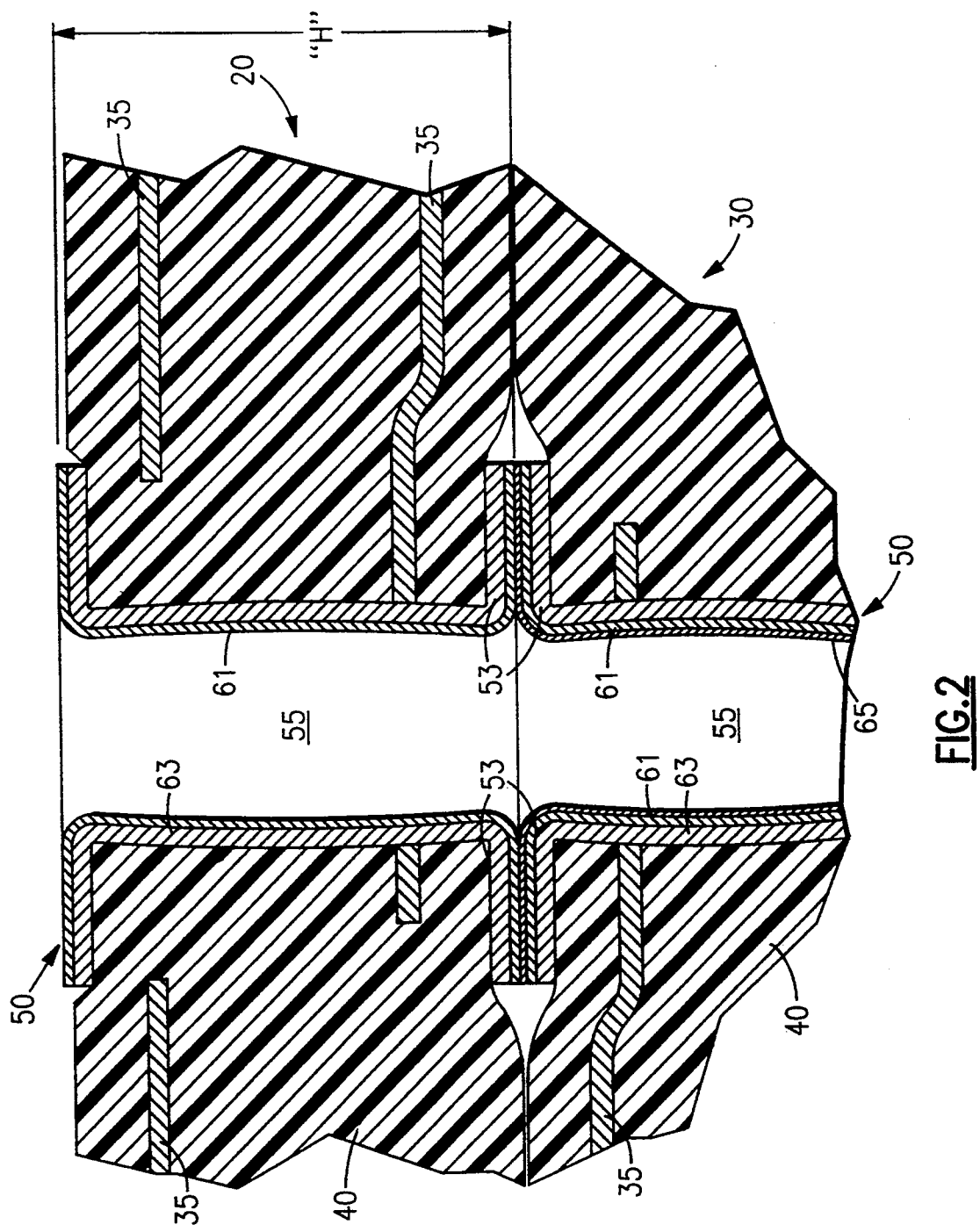

In FIG. 2, both layered subassemblies are shown as being engaged and appropriate pressure applied. In a preferred embodiment, such engagement occurs at room temperature and at a pressure of from about 200 pounds per square inch (psi) to about 400 psi. In a preferred embodiment, this pressure was 300 psi. Dimensions of the plated through conductive metal in the preferred embodiment have been selected to provide a controlled compressibility under such pressures. As shown, this compressibility results in a full interface contact between respective facing surfaces of the land portions 53 of each through-hole, thereby assuring effective connection therebetween. Understandably, such connections occur at all paired through-hole locations in these combined subassemblies. As seen in FIG. 2 (and FIGS. 3 and 4), the side walls of the hollow cylindrical portion 55 are of curved configuration.

Figure 3:
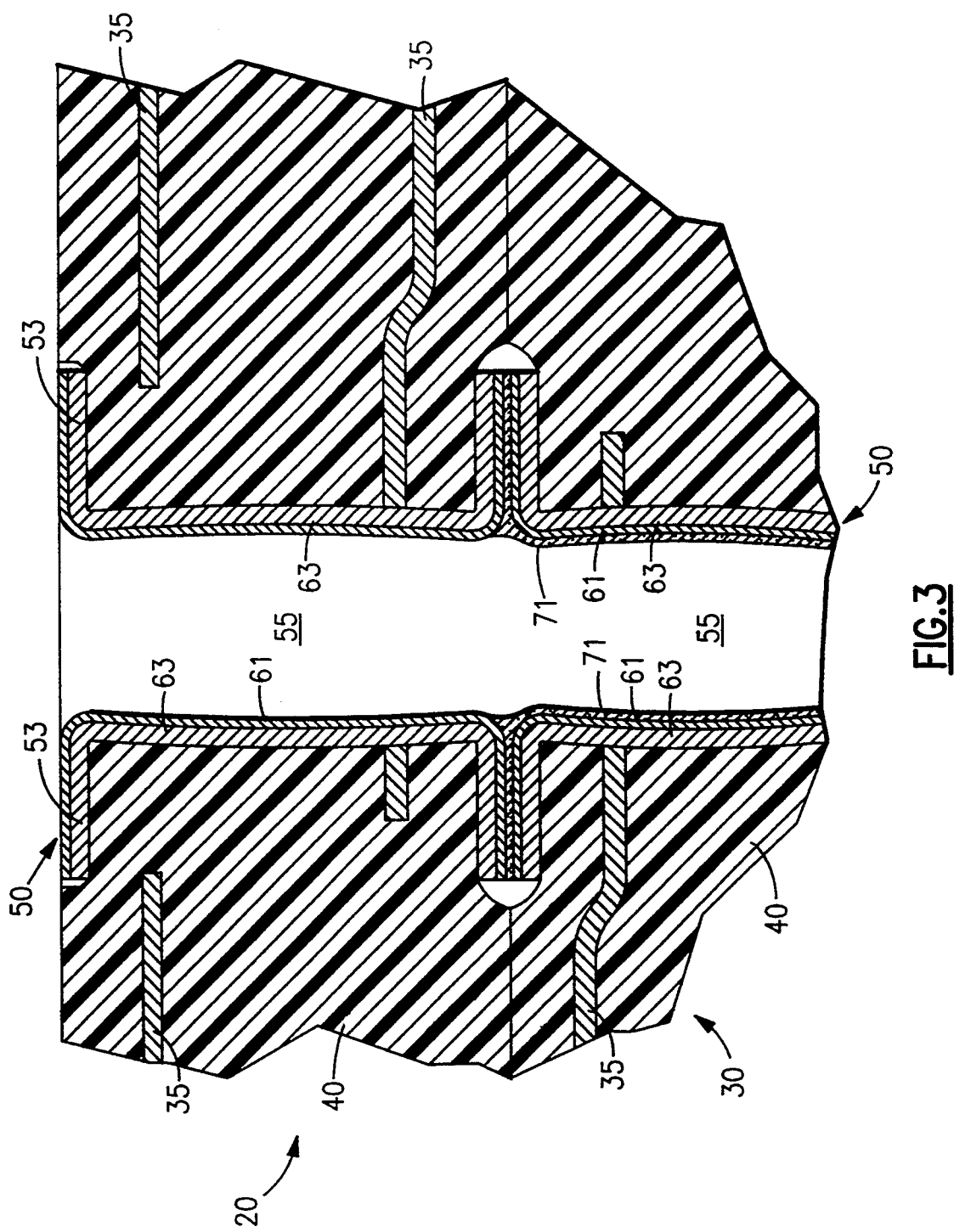
Figure 4:
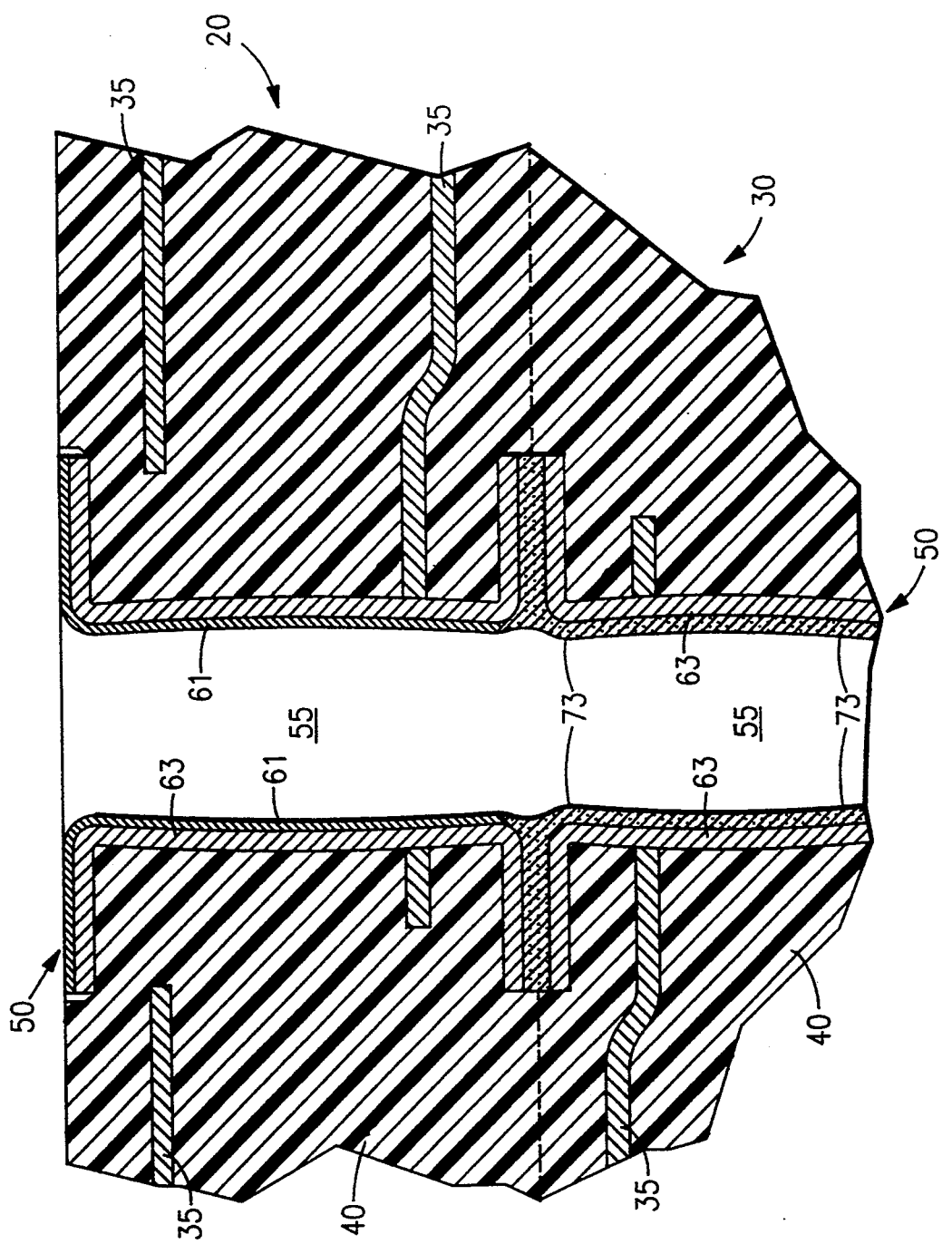

Most significantly, each through-hole at least partially compresses to a reduced overall height (dimension "H" in FIG. 2) slightly less than that prior to compression. In one embodiment, wherein the through-holes of the materials and thicknesses described above were utilized, this resulting reduction in overall height was within the range of from about ten percent to about twenty percent. Such partial compression is shown in FIGS. 2-4 herein. Of further significance, slight deformation also occurs for the respective conductive layers 35 which are connected to the through-hole copper material. This deformation is represented by the bending shown in FIGS. 2–4 for the two conductive layers connected to a respective through-hole. Despite such deformation, no significant adverse impact on these conductive layers, including at the location of connection with the respective through-holes, occurred.

As also seen in FIG. 2, partial embedding of the land segments of each through-hole occurred within the respective, adjacent surface of the dielectric. (It is noted that such embedding occurred in the upper surface of subassembly 20. This results from this upper surface being engaged by a platen or similar member during the compression process.) In comparing FIG. 2 to the graph on FIG. 5, the compression step at FIG. 2 occurs at the location represented by the letter "A". As further seen in FIG. 2, no diffusion of the various metals which form part of the defined through-holes has occurred at this initial stage.

Figure 5:
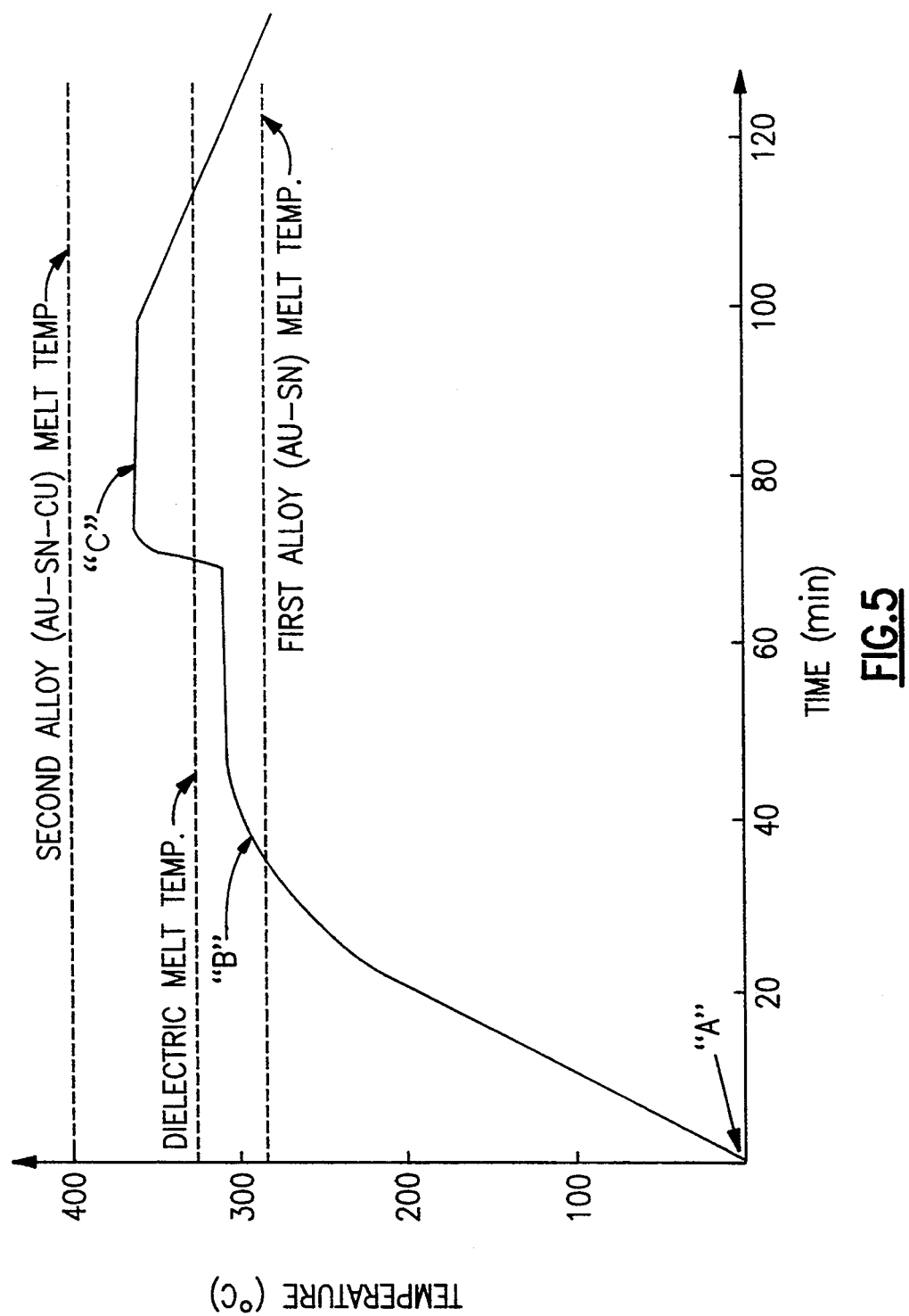
FIG. 5 is a time vs. temperature graph illustrating the sequence of steps of the invention as represented in FIGS. 2-4, FIG. 5 also illustrating examples of the melting points of various materials used in the invention.

In the next step, as shown in FIG. 3, the compressed subassemblies are heated to a temperature, significantly, above that of the eutectic (first alloy) melting point of the gold and tin metal layers. This occurs at the aforementioned pressure of 300 psi but below the melting point of the dielectric PTFE material 40. As a result, the gold and tin layers at least partially melt (as shown) to form what can be referred to as a first alloy of these two metals. In a preferred embodiment, these subassemblies were heated to a temperature of about 280° C. to about 320° C. for a period of about 20 minutes to about 80 minutes. As stated, this is below the melting point of the PTFE dielectric, determined to be about 330° C. A preferred time for this extended heating is 60 minutes. In addition to the gold-tin alloy as defined, partial diffusion of the underlying copper into this alloy may occur at this stage. This first alloy is represented by the new cross-hatching in FIG. 3 and identified by the numeral 71. In comparing FIG. 3 to FIG. 5, the step shown in FIG. 3 can be represented by the letter "B" in FIG. 5. As shown in FIG. 5, this structure has now exceeded the melting point of this first alloy but is less than the designated melting point of the dielectric. In FIG. 5, these heated and compressed subassemblies are shown as being retained at the above temperature and pressure for a time period of about 20 minutes, or a total period of approximately 70 minutes from the time of initial heating. Heating at this pressure assures continual diffusion of the copper into the gold-tin alloy to form what can be referred to as a second alloy of the three metals. Importantly, this new alloy possesses a melting point substantially greater than that of the dielectric and of the first alloy. This second alloy melting point is illustrated in FIG. 5. In the embodiment defined above, using the metals and respective thickness defined, this new melting point was determined to be above 390° C. Most importantly, this new alloy solidifies to form a permanent metallurgical bond between the respective pairs of through-holes. As further seen in FIG. 3, each of the respective land portions 53 are substantially fully embedded within the respective dielectric surfaces.

During the aforementioned step, use of a through-hole of hollow configuration provides an added benefit. Specifically, excess liquid metal, if present, will flow inwardly of the cylindrical body and not in an outward direction (which could result in possible bridging to an adjacent bonding surface).

In the next step of the invention, as shown in FIG. 4, the compressed subassemblies are subjected to increased temperature for the purpose of melting the dielectric to finalize the bond between the two assemblies. This occurs at a pressure of 300 psi. In a preferred embodiment, the subassemblies were heated to a temperature of about 330° C. to about 390° C., above the approximate 330° C. melting point for the dielectric PTFE. In one example, this temperature was 380° C., the subassemblies held at said temperature for about 30 minutes. Significantly, this temperature is below the melting point of the gold-tin-copper (second) alloy, which alloy will thus remain solid and thereby prevent incursion of melted dielectric therein. Such incursion could adversely affect the electrical connection between the respective through-holes. This second alloy is shown in FIG. 4 by the cross-hatching identified by the numeral 73. As seen, a substantially solid bond occurs between the respective facing land surfaces of each through-hole. Further, this new alloy is shown to extend downwardly along the internal surfaces of the lower through-hole. In the illustrated embodiment, such alloy formation is not seen to occur along the inner surfaces of the upper through-hole, wherein the aforementioned second metal (tin) was not utilized. The previous line of demarcation between the two subassemblies is partially removed in FIG. 4 to illustrate the substantial homogeneous bonding between the respective dielectric materials in these now fully bonded subassemblies.

The step shown in FIG. 4 can be represented by the letter "C" in FIG. 5.

Following this heating of the compressed subassemblies, the bonded subassemblies are then cooled at a predetermined rate, such cooling occurring at the 300 psi pressure maintained continuously throughout the process defined herein. In a preferred embodiment, cooling occurred at a rate of about 2° C. per minute until a temperature of about 260° C. was reached, following which accelerated cooling was accomplished. This cooling occurred using known equipment and processes, and further description is not believed necessary.

Finally, with the newly formed multilayered structure fully bonded, the applied pressure (300 psi) was removed.

The two subassemblies formed in accordance with the teachings described above may now be utilized as a multilayered circuit board assembly. Alternatively, such subassemblies may be combined with other subassemblies and treated in accordance with the teachings herein to form an even larger structure. The teachings herein may be used to produce printed circuit boards of conventional external (width and length) dimensions as well as those of much greater or lesser dimensions.

Thus, there has been shown and described a process for making a multilayered circuit board assembly wherein individual layered subassemblies are uniquely bonded together in such a manner that effective electrical coupling between respective pairs of through-holes thereof occurs. The method as defined herein possesses at least two unique features: (1) the use of compressible through-holes which assure effective engagement between respective pairs of such elements in structures utilizing several thereof, as is typically required; and (2) a dual heating step wherein the compressed subassemblies are initially heated to below the dielectric melting point for a predetermined time period to assure formation of an alloy having a melting point significantly greater than that of the dielectric, thereby permitting subsequent elevated heating of the compressed subassemblies to above the dielectric melting point. The latter feature is considered particularly noteworthy because the formed bond between the respective through-holes substantially prevents melted dielectric from incursion therein, which could adversely affect the formed bond between these conductive elements. Significantly, the invention substantially eliminates this from occurring to result in an end product of high integrity.

While there have been shown and described what are at present considered embodiments of the invention, it will be obvious to those skilled in the art that various changes and modifications can be made therein without departing from the scope of the invention as defined by the appended claims.

What is claimed is:

1. A method of making a multilayered circuit board assembly including at least two layered subassemblies each including at least one dielectric layer, electrically conductive wiring in the form of at least one conductive layer and at least one conductive through-hole therein, said method comprising the steps of:

aligning said layered subassemblies relative to one another such that at least a first of said conductive through-holes of one layered subassembly is aligned with and engages a second conductive through-hole in a second layered subassembly, said first and second conductive through-holes each of a first height and including a layer of first metal thereon, said second conductive through-hole further including a layer of second metal thereon;

subjecting said aligned and engaged layered subassemblies to a predetermined pressure sufficient to cause at least partial reduction of said first height of said first and second engaged conductive through-holes;

heating said layered subassemblies having said through-holes having said reduction of said first height to a pre-established temperature for a predetermined time period sufficient to form a metallurgical bond between said first and second metals of said conductive through-holes; and cooling said layered subassemblies.

2. The method of claim 1 wherein said pre-established temperature is within the range of from about 280° C. to about 320° C., said predetermined time period is from about 20 minutes to about 80 minutes, and said predetermined pressure is from about 200 PSI to about 400 PSI.

3. The method of claim 2 wherein said cooling occurs while said layered subassemblies are engaged at said predetermined pressure.

4. The method of claim 3 wherein said cooling is accomplished at an established rate.

5. The method of claim 1 wherein said first and second layered subassemblies are engaged at room temperature.

6. The method of claim 1 wherein said metallurgical bond comprises an alloy of said first and second metals having a melting point substantially greater than the melting point of the dielectric materials of said dielectric layers in said layered subassemblies, said method further comprising the step of heating said layered subassemblies after said predetermined time period and prior to said cooling to an elevated temperature greater than said pre-established temperature but less than said melting point of said alloy.

7. The method of claim 6 wherein said heating of said layered subassemblies to said elevated temperature occurs while said layered subassemblies are engaged at said predetermined pressure.

8. The method of claim 6 wherein said elevated temperature is sufficient to cause said dielectric materials to at least partially melt in the regions immediately surrounding said engaged conductive through-holes.

9. The method of claim 6 wherein said pre-established temperature is within the range of from about 280° C. to about 320° C., said predetermined time period is from about 20 minutes to about 80 minutes, and said elevated temperature is within the range of from about 330° C. to about 390° C.

10. The method of claim 6 wherein said predetermined pressure is within the range of from about 200 PSI to about 400 PSI.

11. The method of claim 6 wherein said cooling occurs while said layered subassemblies are engaged at said predetermined pressure.

12. The method of claim 11 wherein said cooling is accomplished at an established rate.

13. The method of claim 1 wherein said partial reduction of said first height of said through-holes is within the range of from about ten percent to about twenty percent.

* * * * *